(12) United States Patent
Cook et al.

(10) Patent No.: US 11,456,569 B2
(45) Date of Patent: Sep. 27, 2022

(54) ELECTRICAL FAULT DETECTION FOR A MODULAR BUSWAY

(71) Applicant: Veris Industries, LLC, Tualatin, OR (US)

(72) Inventors: Martin Cook, Tigard, OR (US); Aaron Parker, Portland, OR (US)

(73) Assignee: Veris Industries, LLC, Tualatin, OR (US)

( * ) Notice: Subject to any disclaimer, the term of this patent is extended or adjusted under 35 U.S.C. 154(b) by 593 days.

(21) Appl. No.: 16/220,672

(22) Filed: Dec. 14, 2018

(65) Prior Publication Data

US 2019/0190219 A1 Jun. 20, 2019

Related U.S. Application Data

(60) Provisional application No. 62/598,840, filed on Dec. 14, 2017.

(51) Int. Cl.
*H02H 3/00* (2006.01)
*H01R 25/14* (2006.01)
(Continued)

(52) U.S. Cl.
CPC .......... *H01R 25/142* (2013.01); *G01R 21/06* (2013.01); *G06F 1/26* (2013.01); *H01H 71/12* (2013.01);
(Continued)

(58) Field of Classification Search
CPC .............. H01R 25/142; H01R 13/7036; H01R 13/6683; H01H 71/12
(Continued)

(56) References Cited

U.S. PATENT DOCUMENTS 3,826,951 A 7/1974 Mater et al.
3,924,160 A 12/1975 Maier et al.
(Continued)

FOREIGN PATENT DOCUMENTS

CH 681749 A5 5/1993
FR 2745911 B1 1/1999
(Continued)

OTHER PUBLICATIONS

The International Bureau of WIPO; International Preliminary Report on Patentability for International App. No. PCT/US2018/065715 dated Jun. 25, 2020, 9 pages.
(Continued)

*Primary Examiner* — Jared Fureman
*Assistant Examiner* — Lucy M Thomas
(74) *Attorney, Agent, or Firm* — Chernoff, Vilhauer, McClung & Stenzel, LLP

(57) ABSTRACT

A busway for power distribution to equipment positioned in information technology racks includes a plurality of locations in the busway suitably being configured to receive a plurality of detachably engageable taps. The busway, which are external to the information technology racks, includes a plurality of segments, each of which are detachably engaged with one another and including at least one of the plurality of locations. The busway provides power to the information technology racks by respective taps, where each of the taps includes a respective electrical sensor that senses at least one of a voltage level and a current level. Each of the electrical sensors providers an output signal to a computing device.

18 Claims, 15 Drawing Sheets

(51) Int. Cl.
*H05K 7/14* (2006.01)
*G06F 1/26* (2006.01)
*G01R 21/06* (2006.01)
*H04L 12/10* (2006.01)
*H01H 71/12* (2006.01)
*H01R 13/66* (2006.01)
*H01R 13/703* (2006.01)

(52) U.S. Cl.
CPC ..... *H01R 13/6683* (2013.01); *H01R 13/7036* (2013.01); *H04L 12/10* (2013.01); *H05K 7/1492* (2013.01)

(58) Field of Classification Search
USPC ........................................................ 361/78
See application file for complete search history.

(56) References Cited

U.S. PATENT DOCUMENTS

| | | | |
|---|---|---|---|
| 4,870,532 A | 9/1989 | Beatty, Jr. et al. | |
| 4,963,820 A | 10/1990 | Medlin | |
| 5,162,725 A | 11/1992 | Hodson et al. | |
| 5,384,712 A | 1/1995 | Oravetz et al. | |
| 5,834,932 A | 11/1998 | May | |
| 5,933,004 A | 8/1999 | Jackson et al. | |
| 5,986,860 A | 11/1999 | Scott | |
| 6,009,406 A | 12/1999 | Nick | |
| 6,329,610 B1 | 12/2001 | Takubo et al. | |
| 6,774,803 B1* | 8/2004 | Tiffin | H01H 1/0015 340/638 |
| 7,138,924 B2 | 11/2006 | Curtis | |
| 7,862,356 B1 | 1/2011 | O'Leary et al. | |
| 7,982,335 B2 | 7/2011 | Aldag et al. | |
| 8,545,245 B2 | 10/2013 | Dozier | |
| 8,576,082 B2 | 11/2013 | Jones | |
| 8,680,845 B2 | 3/2014 | Carpenter et al. | |
| 8,911,248 B1* | 12/2014 | Wildstone | H02J 9/04 439/213 |
| 8,939,787 B2 | 1/2015 | Kolbe et al. | |
| 9,437,387 B1 | 9/2016 | Kaplan et al. | |
| 2001/0043062 A1 | 11/2001 | Reid | |
| 2012/0327547 A1* | 12/2012 | Andersson | H02H 3/087 361/93.4 |
| 2015/0380917 A1* | 12/2015 | Ross | H01R 43/26 361/679.02 |
| 2017/0343592 A1 | 11/2017 | Zhang et al. | |

FOREIGN PATENT DOCUMENTS

| | | |
|---|---|---|
| JP | H07-14252 B2 | 2/1995 |
| WO | 2011068935 A1 | 6/2011 |
| WO | 2013/152881 A1 | 10/2013 |

OTHER PUBLICATIONS

United States Patent and Trademark Office; International Search Report and Written Opinion for International App. No. PCT/US2018/065715 dated Mar. 7, 2019; 11 pages.

European Patent Office; Extended European Search Report for European Patent Application No. 18887481.2 dated Apr. 16, 2021, 8 pages.

* cited by examiner

US 11,456,569 B2

ELECTRICAL FAULT DETECTION FOR A MODULAR BUSWAY

CROSS-REFERENCE TO RELATED APPLICATIONS

This application claims the benefit of U.S. Provisional App. No. 62/598,840, filed Dec. 14, 2017.

BACKGROUND OF THE INVENTION

The present invention relates to electrical fault detection for a building that includes busways, such as a modular data center.

Information processing requirements continue to rise as businesses seek to provide increased processing capability. The information handling system generally processes, compiles, stores, and/or communicates information or data. The information handling systems have varied spatial, hardware, and software requirements depending on the implementation which tends to require particularized configurations. Data centers incorporate a substantial number of such information hanging systems to provide storage and processing for desired computing needs. As the data center includes an increasing number of information handling systems, the power distribution requirements tend to increase. Unfortunately, the design of such power distribution tends to result in electrical faults.

What is desired, therefore, is a power metering system for electrical fault detection.

DETAILED DESCRIPTION OF PREFERRED EMBODIMENTS

Figure 1:
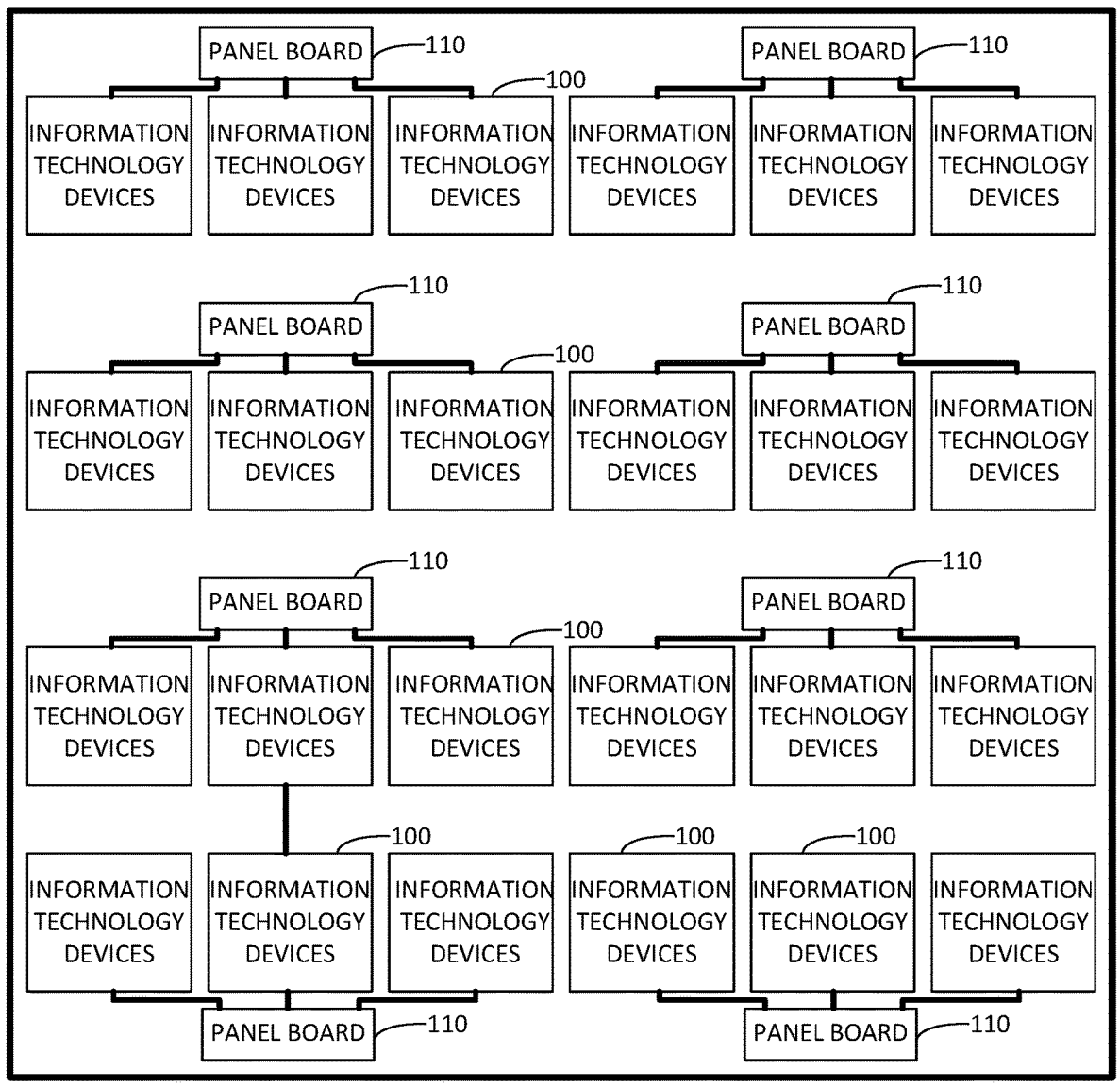
FIG. 1 illustrates a data center with panel boards and information technology devices.
Figure 2:
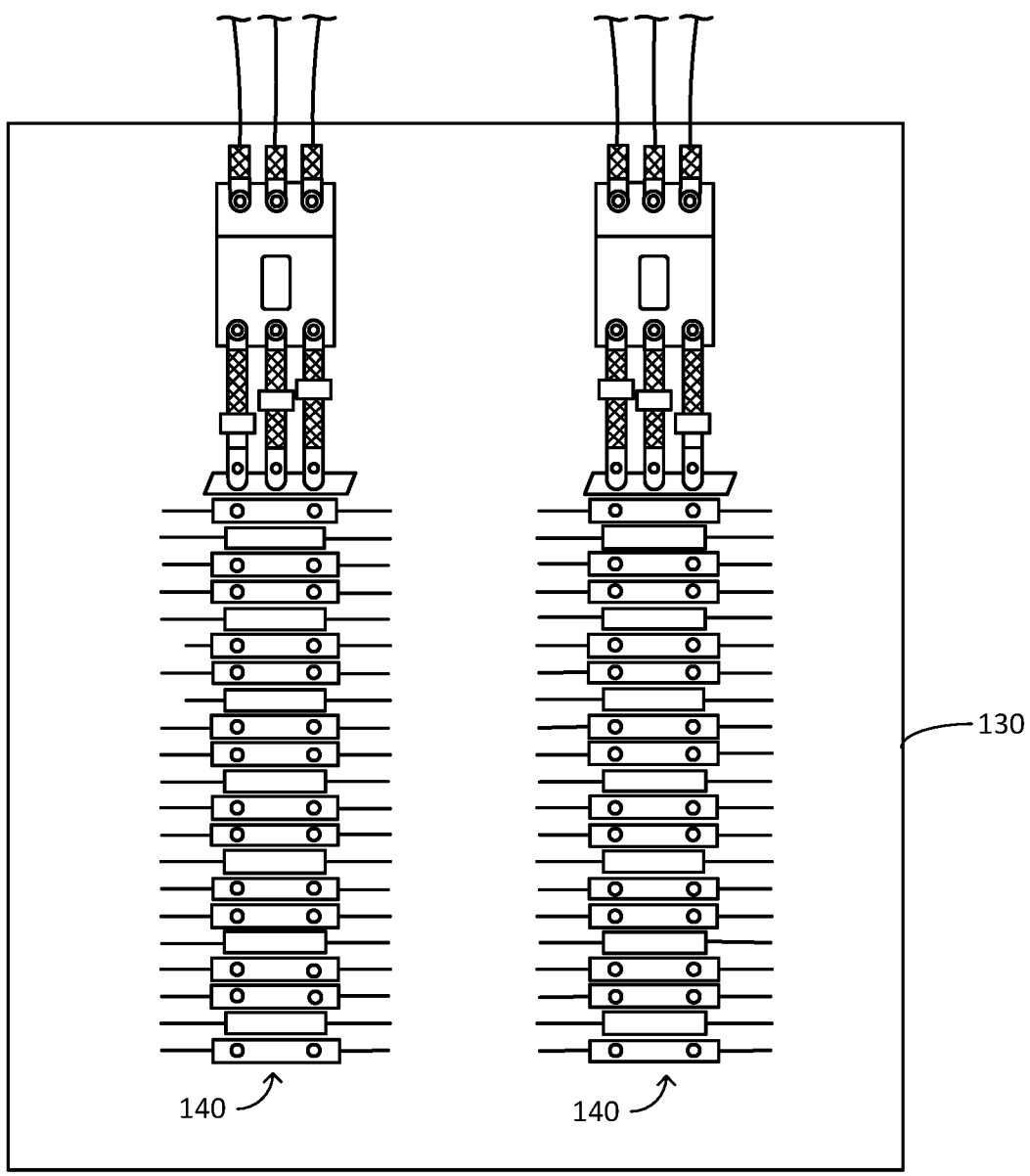
FIG. 2 illustrates a panel board.

Referring to FIG. 1, within a building, such as a data center a factory floor, a manufacturing plan, an assembly plant, an industrial site, one technique for providing power distribution to the information technology, such as servers, switches, hard drives, etc., traditionally include a relatively small number of large information technology devices 100 that receive power from a relatively small set of panel boards 110. Referring also to FIG. 2, each of the panel boards typically includes a metal case 130 enclosing a few rows of circuit breakers 140, where the power is distributed through the circuit breakers out to the information technology loads. Typically, the panel boards are rated from 1.5 kVA to 75 kVA and may come assembled by the vendor or they may be assembled in the field by an electrical contractor. Individual branch circuits or power cables are cut, terminated, and connected in the field by the electrical contractor. The cables are run either overhead in cable trays (e.g., ladder trays), or they are run under a raised floor. The relatively small number of large information technology devices are seldom changed except during a scheduled downtime of a major information technology upgrade. The panel boards are arranged in a relatively low density and accordingly provide a relatively low power density in the data center. Unfortunately, using such a set of panel boards is problematic when the density of the information technology devices reaches a substantial number of devices, such as thousands of information technology devices in a single relatively compact data center. Further, it is problematic to include additional power circuits with such panel boards without disturbing nearby exiting information technology devices. Also, as the power density increases, the number of power feeds tends to clog the plenum with conduits thereby making changing the power distribution difficult. In addition, the number of power feeds increases substantially when the loads include multiple redundancies.

Figure 3:
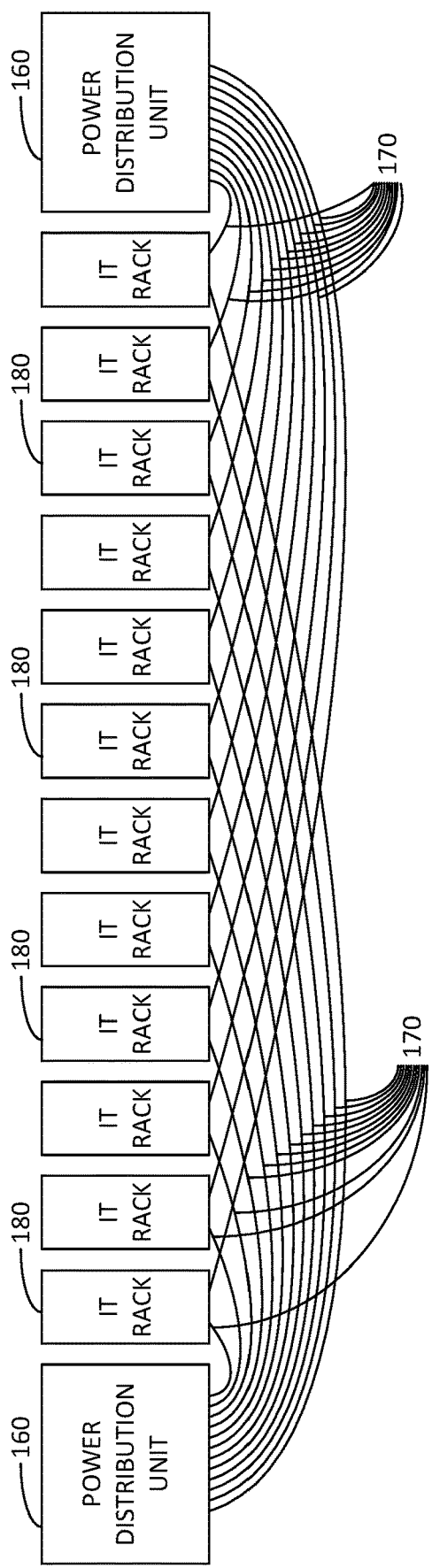
FIG. 3 illustrates power distribution units and information technology racks.

Referring to FIG. 3, in a modified power distribution system for information technology, the main data center power may be distributed to multiple power distribution units 160 (PDUs), each of which is typically rated from 50 kVA to 500 kVA throughout the information technology space. In some cases PDUs without transformers are also referred to as remote power panels (RPPs). The PDUs are fed from centralized sub-feed breakers and are generally spaced along the perimeter of the space, throughout the data center. Some PDUs have an information technology rack form factor that line up with in a row of racks providing improved aesthetics for the space and bring the distribution closer to the loads. Branch circuits 170 are distributed from the PDUs to the information technology equipment. Each information technology enclosure 180 uses one or more branch circuits. Unfortunately, it is problematic to make circuit changes on energized wiring which can be dangerous. The PDUs also take up a significant percentage of the floor space and the floor load weight capacity. In practice, large transformer based PDUs often run out of breaker positions before being fully populated. Also, large transformer based PDUs generate excessive waste heat that need to be cooled.

Figure 4:
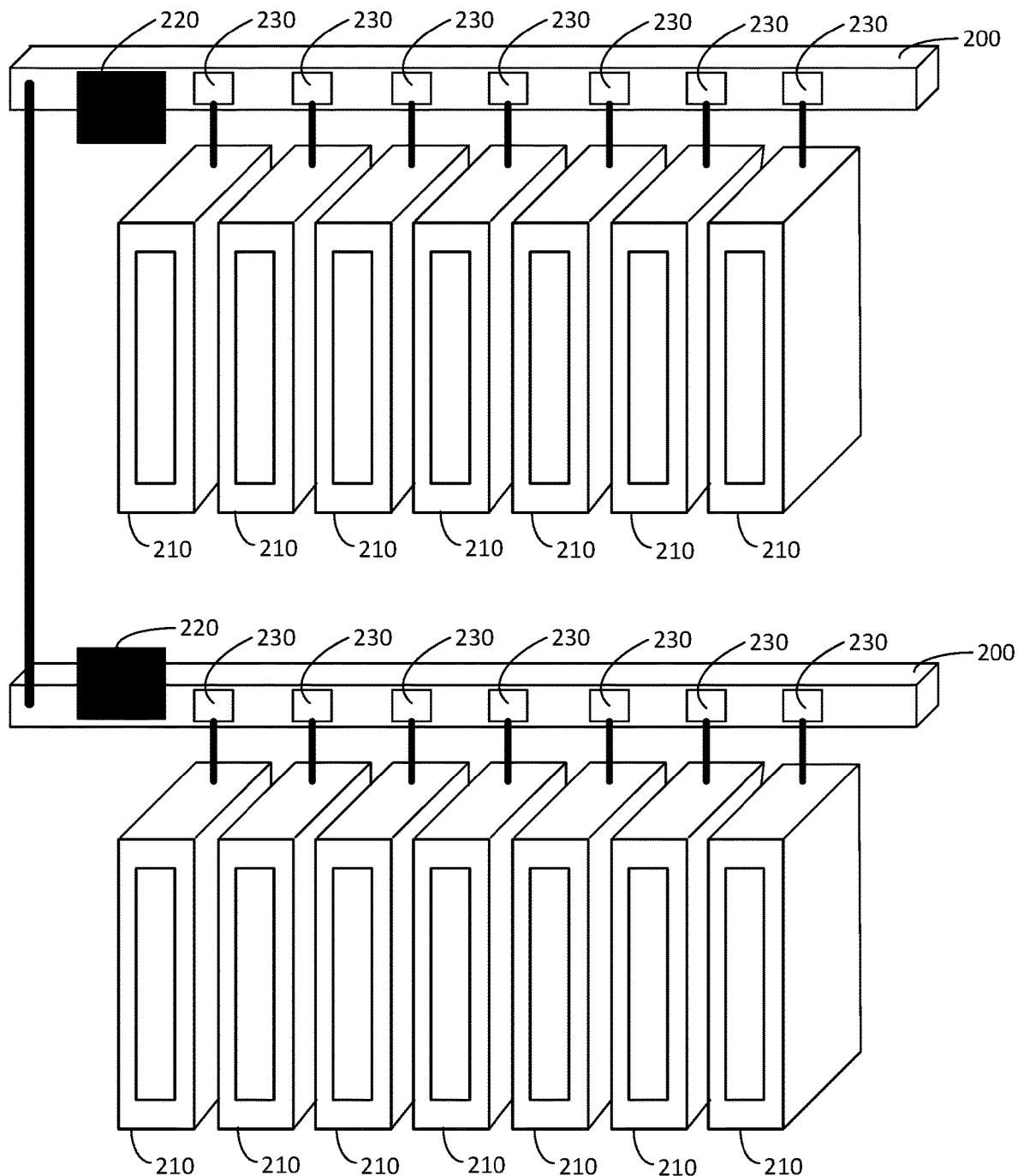
FIG. 4 illustrates a busbar power distribution system and information technology racks.

To address the needs of high density internet technology devices, a more flexible, a more manageable, a more reliable, and a more efficient structure is desirable. Referring to FIG. 4, a power bus, generally referred to as a busway 200, may be installed over internet technology equipment 210 arranged as a series of rows. The installation of the busway includes installing a series of sub-feed breakers 220 which may be interconnected with one or more busways, securing the busway in place by attaching it with threaded rods to the ceiling, running wire from the breakers to the busway feed units, and then inserting plug-in units 230 to the busway and routing them to the internet technology racks. In some cases, the busway is installed under the internet technology equipment. With such a structure, there is zero or substantially zero footprint of the power distribution on the data center room floor making more space available for information technology equipment. Also, the busway provides improved cable management and tracing, with the distribution cable being from a plug-in unit 230 located directly over or under respective information technology equipment. Also, the length of the cables may be reduced with the fixed distance from the busway to each information technology rack. Further, it is simpler to add, move, and change information technology racks because the cables are not stacked on top of one another and the plug-in units can be readily detached and another plug-in unit readily attached, without interrupting the power distribution.

Rather than including a set of traditional circuit breaker panels with bolted wire terminations, the plug-in units may have a backplane into which pre-terminated circuit breaker modules may be installed. This arrangement reduces or otherwise eliminates the need for excessive on-site termination of wires.

By way of example, information technology may be implemented on one or more information technology devices. An information technology device can include any instrumentality or aggregate of instrumentalities operable to compute, classify, process, transmit, receive, retrieve, originate, switch, store, display, manifest, detect, record, reproduce, handle, and/or utilize any form of information, intelligence, or data for business, scientific, control, entertainment, and/or other purposes. For example, an information technology device can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, an information technology device can include processing resources for executing machine-executable code, such as a central processing unit (CPU), a programmable logic array (PLA), an embedded device such as a System-on-a-Chip (SoC), or other control logic hardware. An information technology device can also include one or more computer-readable medium for storing machine-executable code, such as software or data. Additional components of an information technology device can include one or more storage devices that can store machine-executable code, one or more communications ports for communicating with external devices, and various input and output (I/O) devices, such as a keyboard, a mouse, and a video display. An information technology device can also include one or more buses operable to transmit information between the various hardware components.

Figure 5:
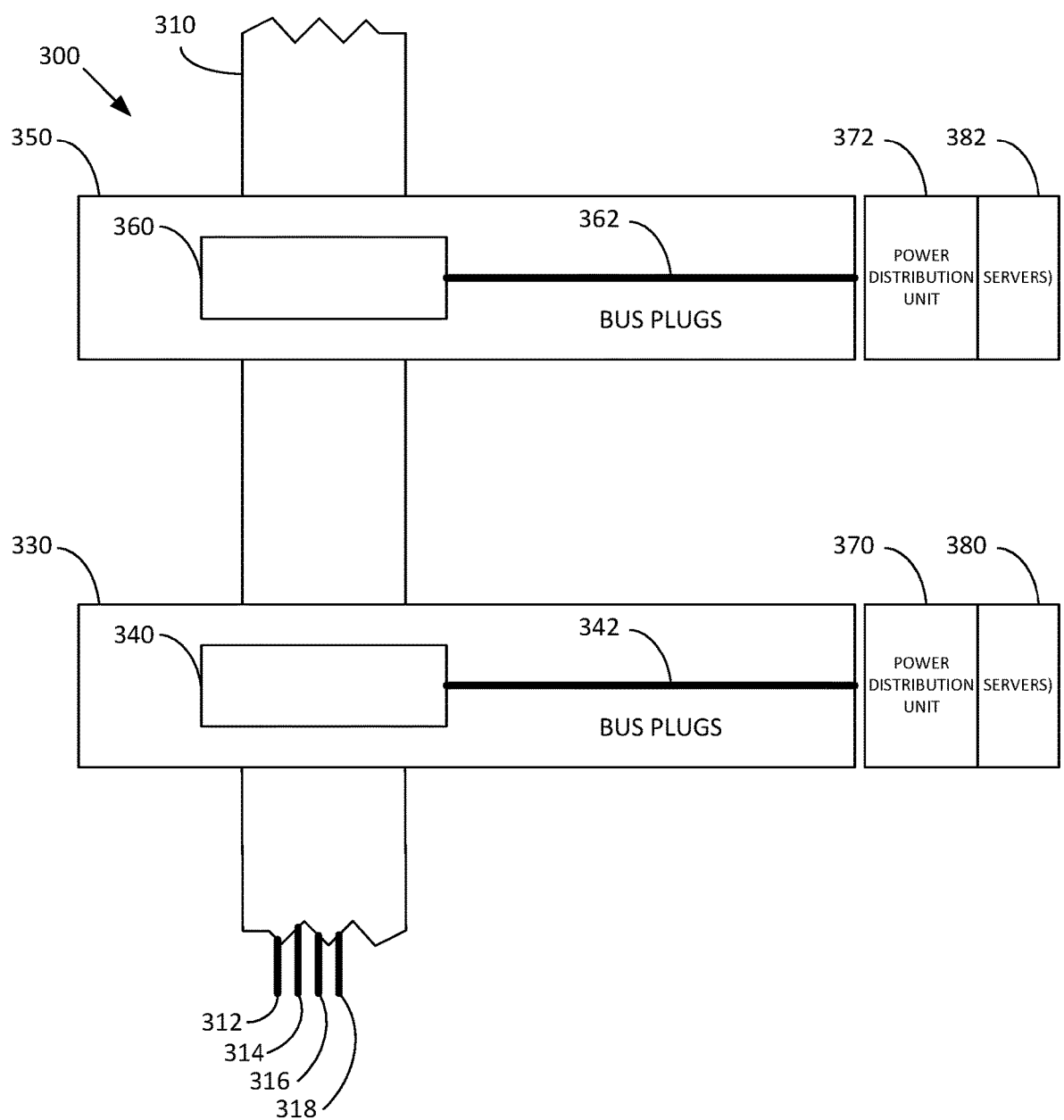
FIG. 5 illustrates a busbar power distribution, power distribution units, and information technology racks.

Referring to FIG. 5, a plan view of an embodiment of a portion of a power distribution network 300 for a modular data center, includes a power busway 310, bus plugs 330 and 350, power distribution units (PDUs) 370, and 372, and server racks 380 and 382. Busway 310 represents large capacity power connections for the modular data center, and provide three-phase AC power for the information handling devices and environmental equipment in the modular data center. As such, busway 310 includes an A-phase conductor 312, a B-phase conductor 314, a C-phase conductor 316, and a neutral conductor 318. For example, busway 310 can provide power at 480/277 VAC, at 400/230 VAC, or at another 3-phase/two-phase/single-phase voltage level, as needed or desired. The busway 310 may include a separate ground conductor. The busway 310 may include a common ground conductor. One or more of busways 310, PDUs 370, 372, and server racks 380 and 382 may be provided with a common earth ground conductor. Busway 310 may be provided with power from one or more power distribution panels (not shown), and can be used to provide balanced power loads to the modular data center, to provide power redundancy for the modular data center, or to provide power to different types of loads in the modular data center. As such, power distribution network 300 can include one or more additional busways, as desired.

Bus plug 330 may include a fused switch module 340 that is connected to the three-phase power conductors 312, 314, 316, and 318, and that provides protected power to PDU 370 via a conductor set 342. For example, the PDU may generally refer to freestanding breaker panels and industrial power strips. The PDU 350 thus provides power from busway 310 to server rack 380. It will be understood that conductor set 342 may include separate conductors to carry the A-phase, B-phase, C-phase, and Neutral power from the busway 310, and can include a ground conductor, as desired. Bus plug 350 may include a fused switch module 360 that is connected to the three-phase power conductors 312, 314, 316, and 318, and that provides protected power to PDU 372 via a conductor set 362. The PDU 350 thus provides power from busway 310 to server rack 382. It will be understood that conductor set 362 may include separate conductors to carry the A-phase, B-phase, C-phase, and Neutral power from the busway 310, and can include a ground conductor, as desired. The power distribution network 300 is a floor mounted power distribution network and bus plugs 330 and 350 are affixed on top of busway 310. In another embodiment, power distribution network 300 is an over-head power distribution network and bus plugs 330 and 350 are affixed underneath busway 310. Server racks 380 and 382 represent one or more information handling devices for performing the computing functions of the modular data center, and can represent a power load of up to 30 kilowatt or more as desired.

In the embodiment where power distribution network 300 includes one or more additional busways, the power distribution network may include one or more additional types of bus plugs, each type being associated with one of the additional busways for interconnecting between the additional busway and the same or different loads.

Figure 6:
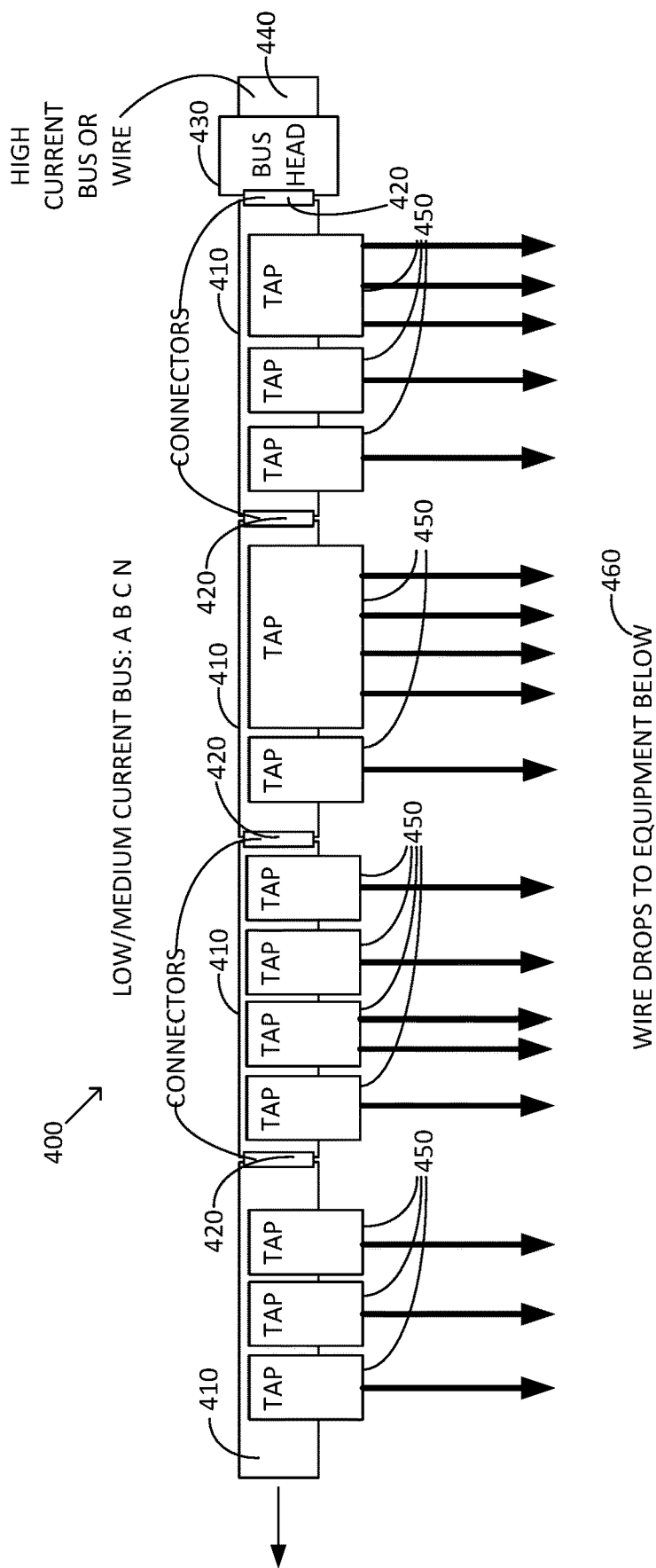
FIG. 6 illustrates a busbar, taps, a head unit, and connectors.

Referring to FIG. 6, the configuration and construction of the busway 400 may use separate segments 410, each of which may be approximately 10 feet long or any other suitable length, which are bolted or otherwise connected together in some manner with a connector 420 to form a longer modular busway. A busway connected to the information devices typically carry a low or medium current that is supplied from a higher current busway 440 or wire via a bus head 430. The higher current busway 440 or wire may supply current to a plurality of different low or medium current busways. A series of taps (e.g., bus plugs) 450 are detachably interconnected to the busways, typically in the form of readily engageable and detachable taps, each of which supplies power to corresponding information technology device(s) 460. In general, "taps", "tap boxes", "stabs", "plug-in unit", "bus plugs", may be used interchangeably. Each of the taps may include one or more wires and/or sets of wires to the corresponding information technology devices.

As a result of use and removal and attachment of taps to the busway over time, the interconnections between the different segments of the busway tend to be stressed or otherwise moved. As the connections are stressed or otherwise moved, the bolted joints tend to loosen which tends to modify the electrical interconnections between the different segments of the busway. As the electrical interconnections between a pair of busway segments tend to move away from one another the substantial current levels can cause an interconnection to overheat and create arc flashes which further degrade the electrical properties of the busway, and in particular the interconnection. The overheating and arc flashes are also are prone to starting an electrical fire within the data center which can be catastrophic for the entire data center. Further, the degraded electrical connection can cause a buildup of corrosion or other materials thereby increasing the resistance and changes the capacitance and/or inductance between different segments. The increased resistance and/or changed impedance lowers the voltage and changes the electrical characteristics along the length of the busway, which may impact the performance of the information technology equipment, and also increases the heat generated by the busway which needs to be dissipated by the data center.

Figure 7:
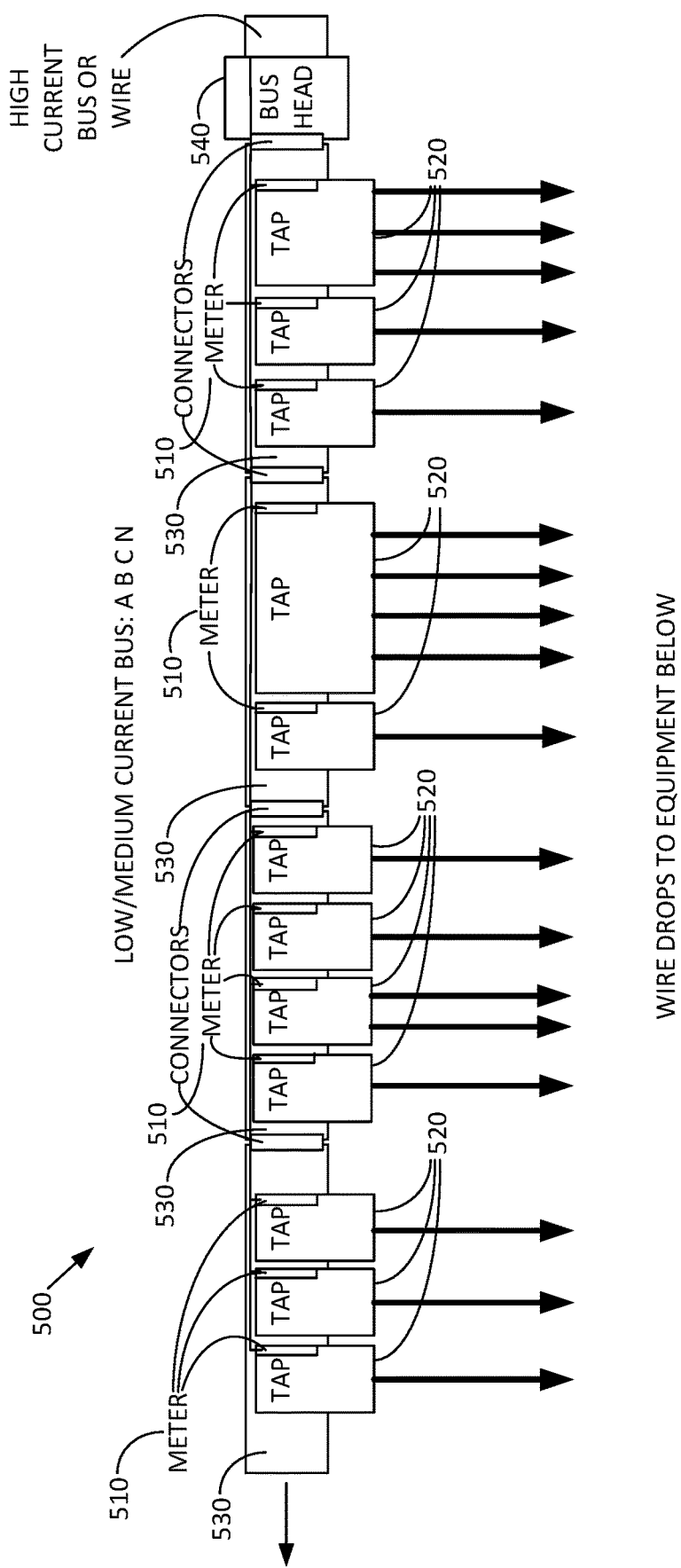
FIG. 7 illustrates a busbar, taps, a head unit, connectors, and meters.
Figure 8:
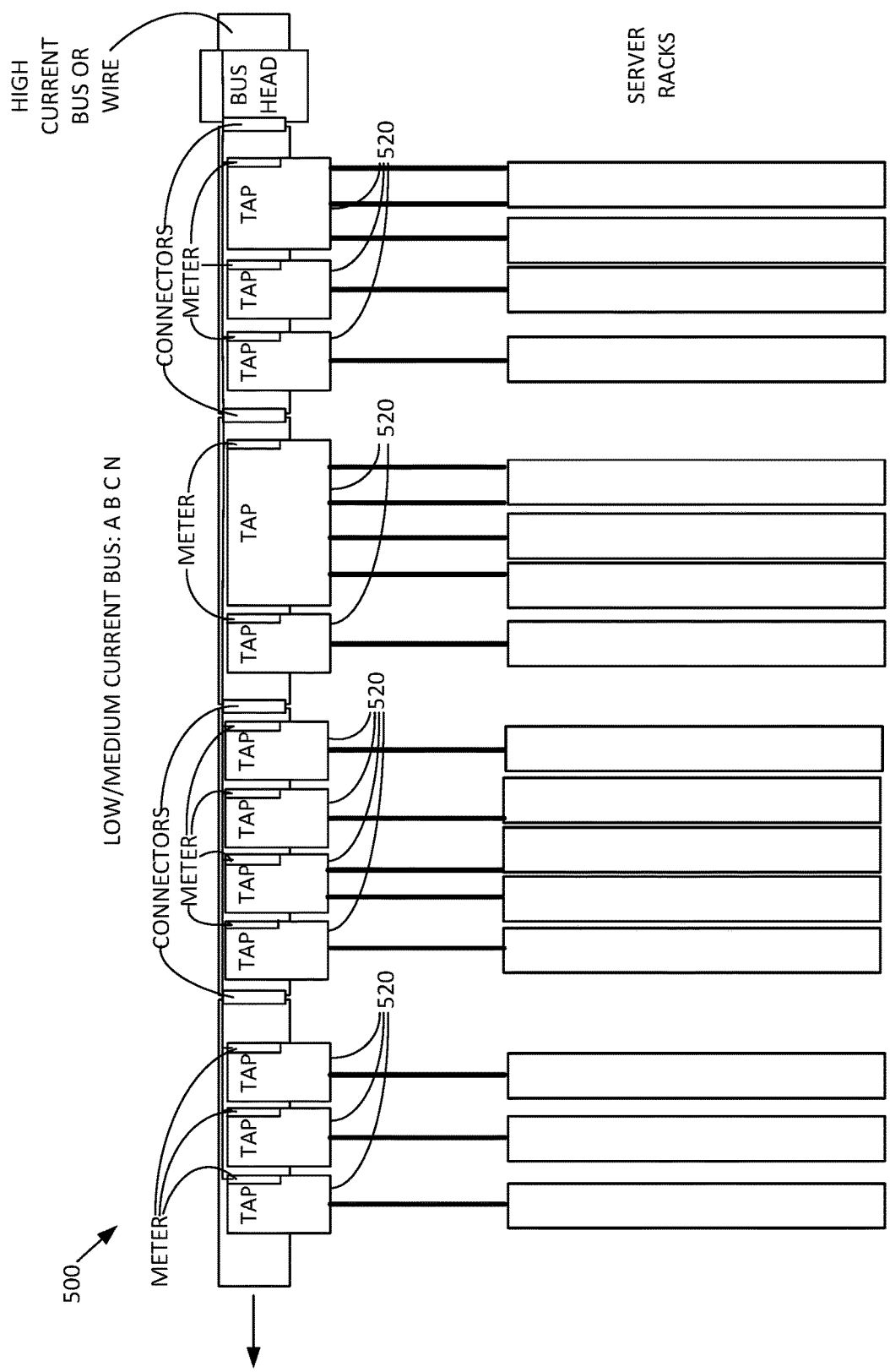
FIG. 8 illustrates a busbar, taps, a head unit, connectors, servers, and meters.

Referring to FIG. 7 and to FIG. 8, a modified busway system 500 includes a respective electrical sensor 510 together with each of the taps 520. The electrical sensor may include a voltage sensor and/or a current sensor. Each of the voltage sensor and/or current sensor may be a direct contact or a non-contact sensor. The electrical sensor may sense the voltage and/or current of the tap and/or busbar 530. The electrical sensor may sense electrical properties from a single phase, two phases, three phases, and/or neutral/ground conductors from the busway. The electrical sensor may be included within the tap enclosure, may be included supported to the exterior of the tap enclosure, and/or may be included with the busway in a position proximate the tap, and more preferably sensing the same electrical characteristics of the same busway segment as the respective tap(s). The electrical sensor preferably senses the voltage as sensed by the respective tap. A head unit 540 may also include an electrical sensor that senses the voltage and/or current in the busway. The head unit 540 senses the electrical characteristics at a location before each of the taps along the busway. Each of the electrical sensors may output an analog signal, such as a 4-20 ma signal, indicative of the voltage and/or current levels. Each of the electrical sensors may output a digital signal, such as a ModBus signal, indicative of the voltage and/or current levels. The current and/or voltage waveforms may be digitized if desired. Further the current and/or voltage waveform, which may be digitized, may be multiplied together to determine energy usage (e.g., real and/or apparent power). A communication bus, such as an Ethernet cable, may be used to interconnect each of the electrical sensors to the head unit. Alternatively, a wireless communication, such as an 802.11 protocol, may be used to interconnect each of the electrical sensors to the head unit. Alternatively, a wireless communication, such as an 802.11 protocol, may be used to interconnect each of the electrical sensors to another of the electrical sensors and the head unit, if desired. Alternatively, a mesh based wireless communication, such as 802.11 protocol, may be used to interconnect each of the electrical sensors to the other electrical sensors and the head unit. Alternatively the busbar, preferably using a higher frequency signal than the busbar power frequency, may be used to interconnect each of the electrical sensors to each other and/or the head unit.

Figure 13:
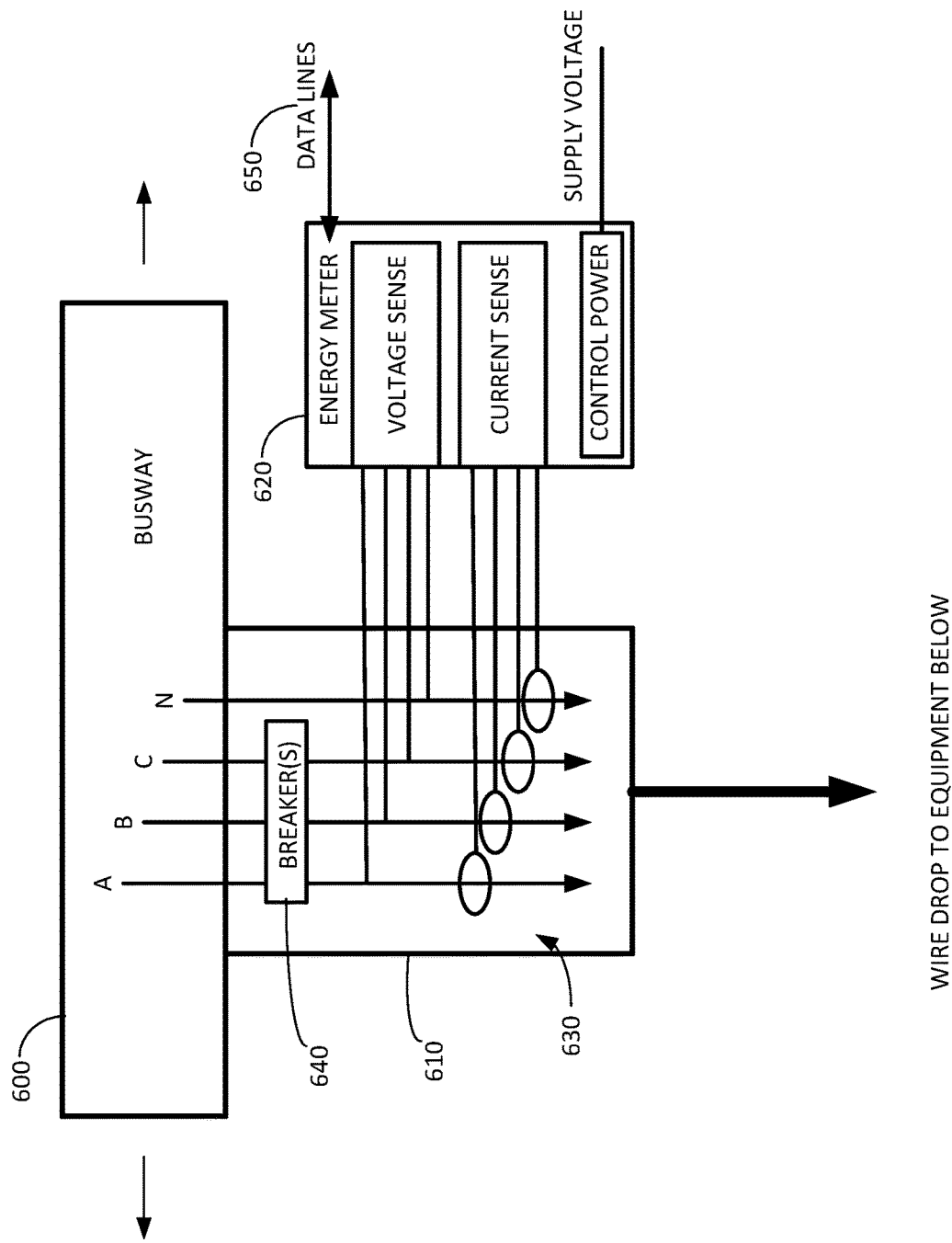
FIG. 13 illustrates an exemplary interconnection of a busway and a tap.

Referring to FIG. 13, an exemplary interconnection between a busway segment 600 and a tap 610 is illustrated together with an energy meter 620. The energy meter 620 may be positioned at a location spaced apart from the tap, supported by the exterior of the tap, or otherwise integrated within the tap. Preferably the electrical connections between the energy meter 620 and the tap 610 are on the load side 630 of any circuit breakers 640 within the tap 610 so that in the event any circuit breaker 640 opens, the energy meter 620 may provide an indication in a data line 650 that such one or more of the circuit breakers opened. In some cases, if the busway head meter and/or other tap energy meters continue to sense non-zero current and/or non-zero voltage while a particular energy meter senses zero current and/or zero voltage, then a signal may be provided indicating that one or more circuit breakers associated with the particular energy meter has opened. In many cases, circuit breakers 640 often have a limited number of opening cycles before their reliability is affected. The system may monitor the number of opening cycles, such as based upon the sensing of zero current and/or zero voltage, especially when other circuit breakers associated with the same and/or different busway segments are simultaneously sensing a non-zero current and/or non-zero voltage. In addition, the tap meters may be configured with the breaker rating (typically in terms of amps), and when the current sensed is sufficiently close to the breaker rating, a warning and/or alarm condition may be signaled.

The electrical sensor, the head unit, an associated computing device, and/or any other data processing device may be used to sense and/or determine various electrical characteristics. Accordingly, the electrical characteristics may be sensed at any desirable location associated with the busways and/or taps. Accordingly, electrical characteristics may be processed at any desirable location with any suitable processing device.

One of the electrical characteristic is the voltage level of each conductor of each phase of the conductor at a respective tap.

Another of the electrical characteristic is the current level of each conductor of each phase of the conductor at a respective tap.

Another of the electrical characteristic is the power factor between the voltage and the current for each conductor of each phase of the conductors at a respective tap.

Another of the electrical characteristic is the angular spacing and/or timing between the power factors between the voltage and the current for a plurality of conductors at a respective tap.

Another of the electrical characteristic is the power of the voltage and the current for each conductor of each phase of the conductors at a respective tap.

Another of the electrical characteristic is the total power of the voltage and the current for each conductor of the conductors at a respective tap.

Another of the electrical characteristic is the balance of the voltage level of each conductor of each phase of the conductor at a respective tap compared to the other respective voltage levels.

Another of the electrical characteristic is the balance of the current level of each conductor of each phase of the conductor at a respective tap compared to the other respective current levels.

Another of the electrical characteristic is the balance of the power factors of each conductor of each phase at a respective tap compared to the other respective power factors.

Another of the electrical characteristic is the balance of the power level of each conductor of each phase at a respective tap compared to the other respective power levels.

Another of the electrical characteristic is the phase sequence (e.g., ABC, ACB, CBA) of the phase angle of the respective phases of the conductors at a respective tap.

The electrical sensor may also include a temperature sensor for sensing the temperature at the respective tap. The data from the temperature sensor may be provided to the head unit or otherwise, as desired. Each of the taps including a respective temperature sensor that senses a temperature level, and each of the temperature sensors providing a temperature signal to a computing device. A processing module that receives the temperature signals and determines electrical characteristics of the plurality of segments of the busway.

Figure 9:
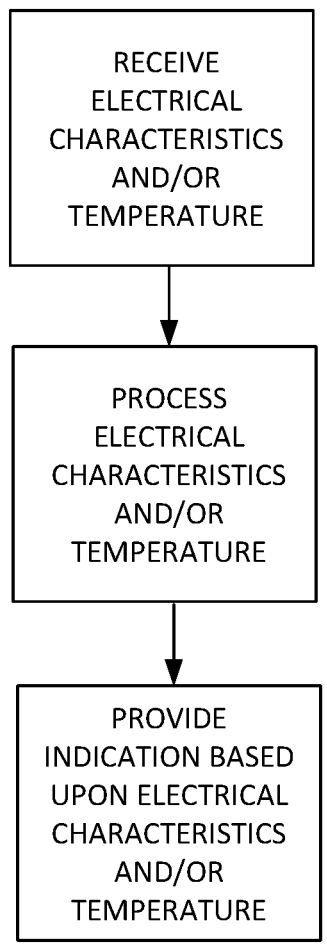
FIG. 9 illustrates receiving, process, and indicating electrical characteristics and/or temperature.

Referring to FIG. 9, one or more of the tap(s), one or more of the head unit(s), and/or one or more of any other processing device may provide the sensed and/or determined electrical characteristics and/or an alarm and/or a warning indication based upon the electrical characteristics and/or temperature data. The alarm and/or warning indications may be based upon a single electrical sensor, the characteristics of a group of electrical sensors, and/or based upon temporal characteristics. By way of example, if the electrical characteristics is sufficiently out of a normal range then an alarm or warning condition may be provided. By way of example, if the electrical characteristics change over time sufficiently out of a normal range then an alarm or warning condition may be provided. By way of example, if the electrical characteristics of the electrical sensors associated with a respective busbar are sufficiently out of the normal range with respect to one another then an alarm or warning condition may be provided. The same applies with the temperature sensor.

For example, if the voltage level of any of the conductors of each phase of the conductor at a respective tap are sufficiently high or low, an alarm and/or warning condition may be indicated.

For example, if the current level of any of the conductors of each phase of the conductor at a respective tap are sufficiently high or low, an alarm and/or warning condition may be indicated. By way of example, the current levels may be in relation to the breaker rating of an associated circuit breaker, as described herein.

For example, if the power factor between the voltage and the current for any of the conductors of each phase of the conductor at a respective tap are sufficiently high or low, an alarm and/or warning condition may be indicated.

For example, if the angular spacing and/or timing between the power factors between the voltage and the current for a plurality of conductors at a respective tap are sufficiently high or low, an alarm and/or warning condition may be indicated.

For example, if the power of the voltage and the current for the total of the conductors of each phase at a respective tap are sufficiently high or low, an alarm and/or warning condition may be indicated.

For example, if the power of the voltage and the current for any of the conductors at a respective tap are sufficiently high or low, an alarm and/or warning condition may be indicated.

For example, if the balance of the voltage level of each conductor of each phase of the conductor at a respective tap compared to the other respective voltage levels are sufficiently high or low, an alarm and/or warning condition may be indicated.

For example, if the balance of the current level of each conductor of each phase of the conductor at a respective tap compared to the other respective current levels are sufficiently high or low, an alarm and/or warning condition may be indicated.

For example, if the balance of the power factors of each conductor of each phase of the conductor at a respective tap compared to the other respective power factors are sufficiently high or low, an alarm and/or warning condition may be indicated.

For example, if the balance of the power level of each conductor of each phase of the conductor at a respective tap compared to the other respective power levels are sufficiently high or low, an alarm and/or warning condition may be indicated.

For example, if the phase sequence (e.g., ABC, ACB, CBA) of the phase angle of the respective phases of the conductors at a respective tap are out of sequence, an alarm and/or warning condition may be indicated.

For example, if the temperature sensor for sensing the temperature at the respective tap is sufficiently high or low, an alarm and/or warning condition may be indicated.

If any of the electrical characteristics and/or temperature compared to one another of a busbar are sufficiently different then an alarm and/or a warning condition may be indicated.

If any of the electrical characteristics and/or temperature compared to one another of a busbar are sufficiently changed over time then an alarm and/or a warning condition may be indicated.

Figure 10:
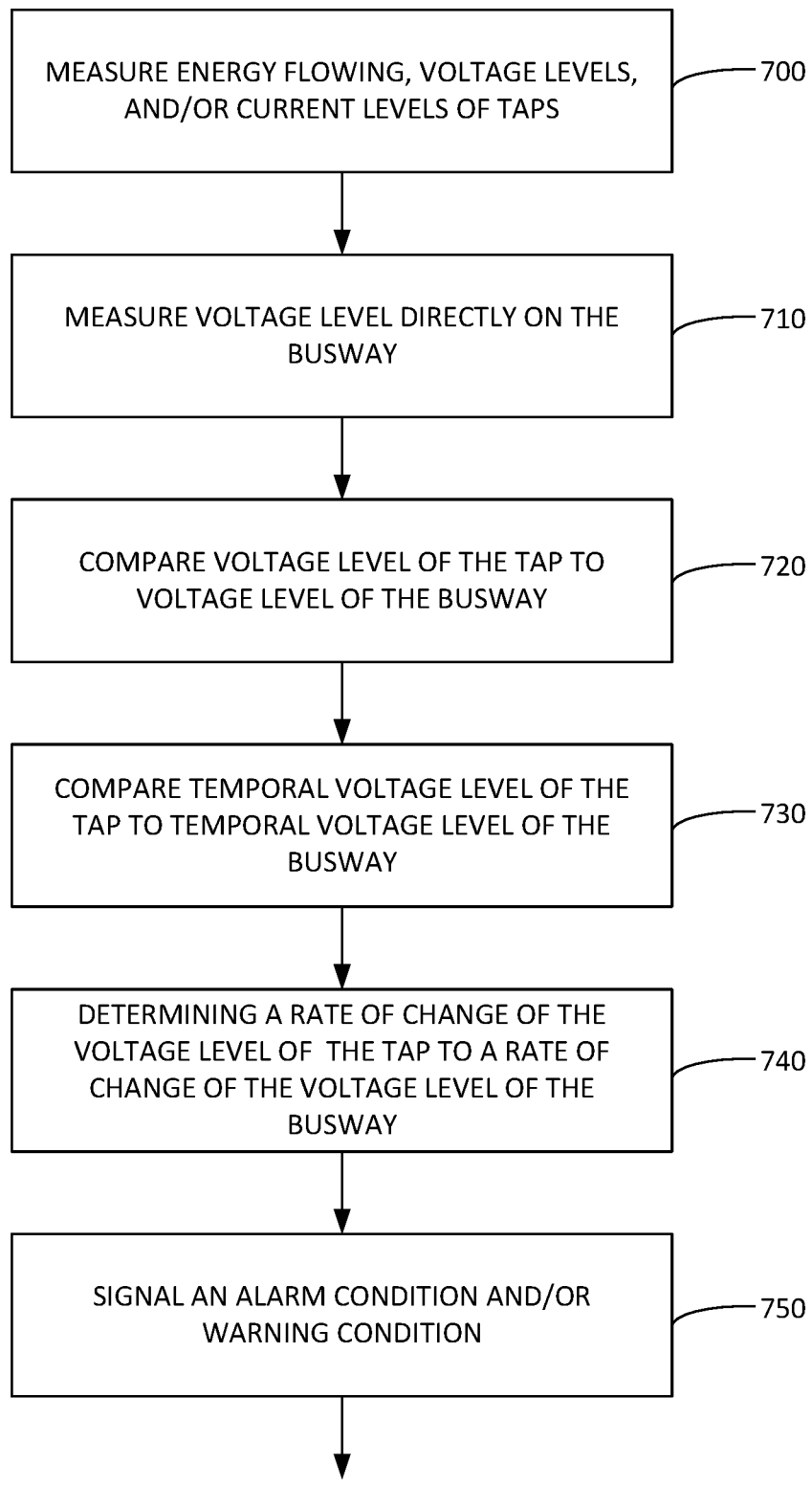
FIG. 10 illustrates a system for determining interconnection characteristics of a tap to a busway.

Referring to FIG. 10, an energy meter may be associated with each of the taps to measure the amount of energy flowing through each of the taps from the busway 700. With the measurement of the amount of energy flowing through each tap, a measurement of the voltage sensed by the respective tap from the busway may be determined 710. With the measurement of the amount of energy flowing through each tap, a measurement of the current sensed by the respective tap from the busway may be determined. The amount of energy flowing, voltage measured, and/or current measured, for each of the taps may also be measured on a per phase basis, if desired. The amount of energy flowing, voltage measured, and/or current measured, for each of the taps may also be measured on a total basis, inclusive of all of the phases if more than a single phase, if desired. The amount of energy flowing, voltage measured, and/or current measured is preferably sensed at position on the tap at a location beyond the physical/electrical interconnection between the busway and the tap, and more preferably beyond any associated circuit breakers. Each of the energy meters may also include a busway voltage sensor that directly senses (inclusive of a direct and/or capacitive voltage sensing techniques) the voltage on the busway at a location proximate the respective tap which would not include the physical/electrical interconnection between the busway and the tap as part of the measurement.

In some instances, the physical/electrical interconnection between the busway and a particular tap is poor, or otherwise builds up corrosion over an extended period of time. The poor physical/electrical interconnection may result in a failure of the interconnection between the busway and the tap, and in the extreme case result in an electrical fire. To determine whether the physical/electrical interconnection is poor, the voltage sensed by the tap may be compared with the voltage directly sensed on the busway at a location proximate the respective tap 720. If the respective sensed voltages are sufficiently different from one another, indicative of a poor electrical interconnection, a warning or an alarm condition may be signaled 750. Further if the respective sensed voltages are sufficiently different from one another based upon a temporal time period 730, such as a day or a week, indicative of a poor electrical interconnection, a warning or an alarm condition may be signaled 750. Moreover, determining a rate of change in the respective voltages over time may be used as a basis for predicting the failure of the interconnection between the busway and a respective tap 740, and used as the basis of a warning or an alarm condition 750. The voltage measurements and differences thereof may be adjusted based upon current levels and/or voltage levels and/or energy flowing.

Figure 11:
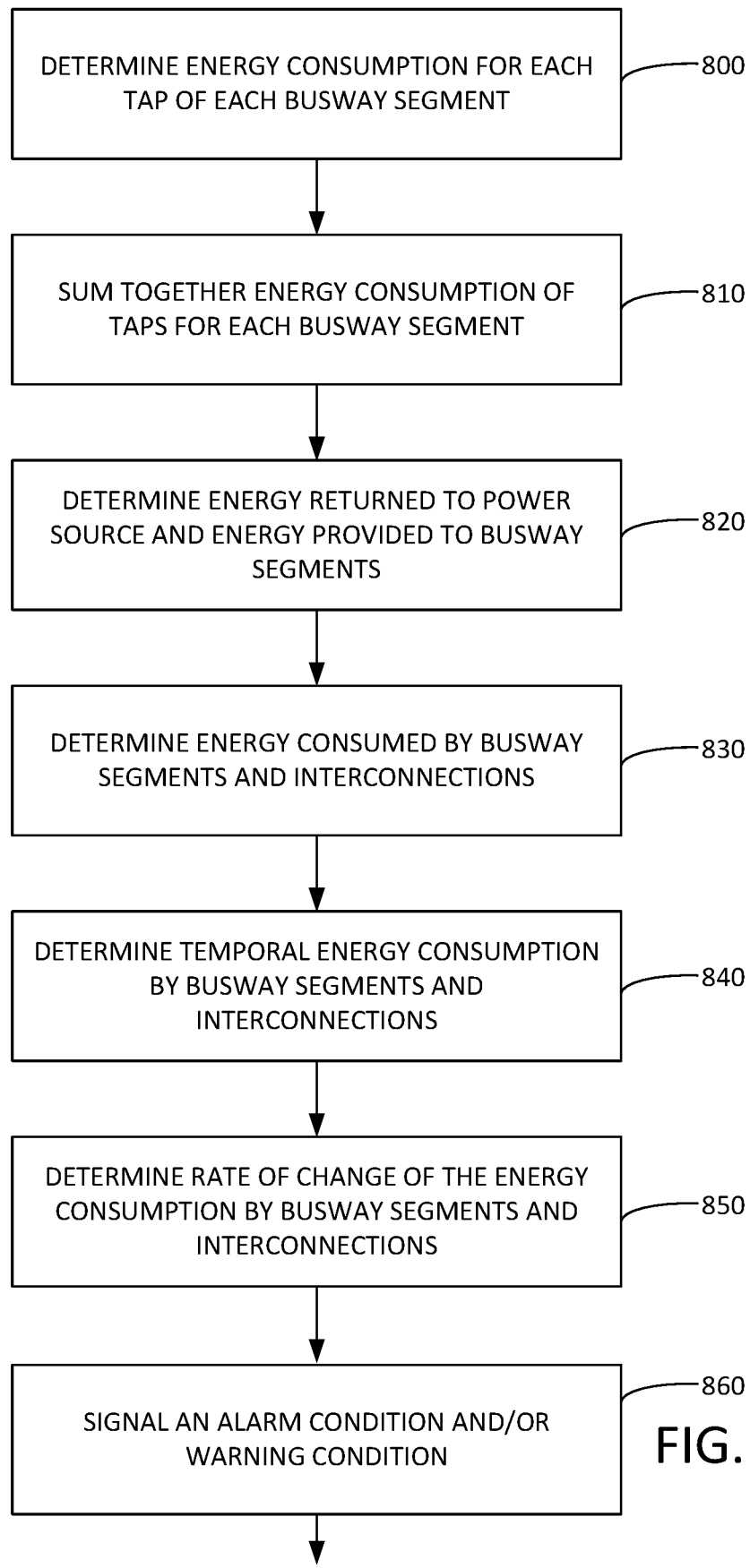
FIG. 11 illustrates a system for determining busway energy dissipation characteristics.

Referring to FIG. 11, it may be desirable to determine the energy dissipation between each segment of the busway. For example, the energy consumption of each tap for each busway segment may be determined 800 and summed together 810. In this manner, the total energy provided to loads from each of the busway segments may be determined. An energy meter measuring any energy that is provided back to the power grid or power source 820 through the end of the busway segments, if any, may be measured. An energy meter measuring any energy that is provided to the set of busway segments from the power source may be measured 820. The energy consumption of each busway segment from the taps and any energy returned back to the power source may be subtracted from the energy that is provided to the set of busway segments. In this manner, the system may determine the energy consumption of the busway segments and their interconnections between the busway segments 830. If the energy consumption of the busway segments and their interconnections are too high a warning or an alarm condition may be signaled 860. Further, a busway segment may develop faults at locations other than the busway segment to busway segment interconnection and/or the tap to busway segment interconnection. Further, if the energy consumption of the busway segments and their interconnections sufficiently increases based upon a temporal time period 840, such as a day or a week, indicative of a poor electrical interconnection, a warning or an alarm condition may be signaled 860. Moreover, determining a rate of change in the energy consumption of the busway segments and their interconnections over time 850 may be used as a basis for predicting the failure of the interconnections between the busways, and used as the basis of a warning or an alarm condition 860. The energy measurements may be adjusted based upon current levels and/or voltage levels and/or energy flowing.

Figure 12:
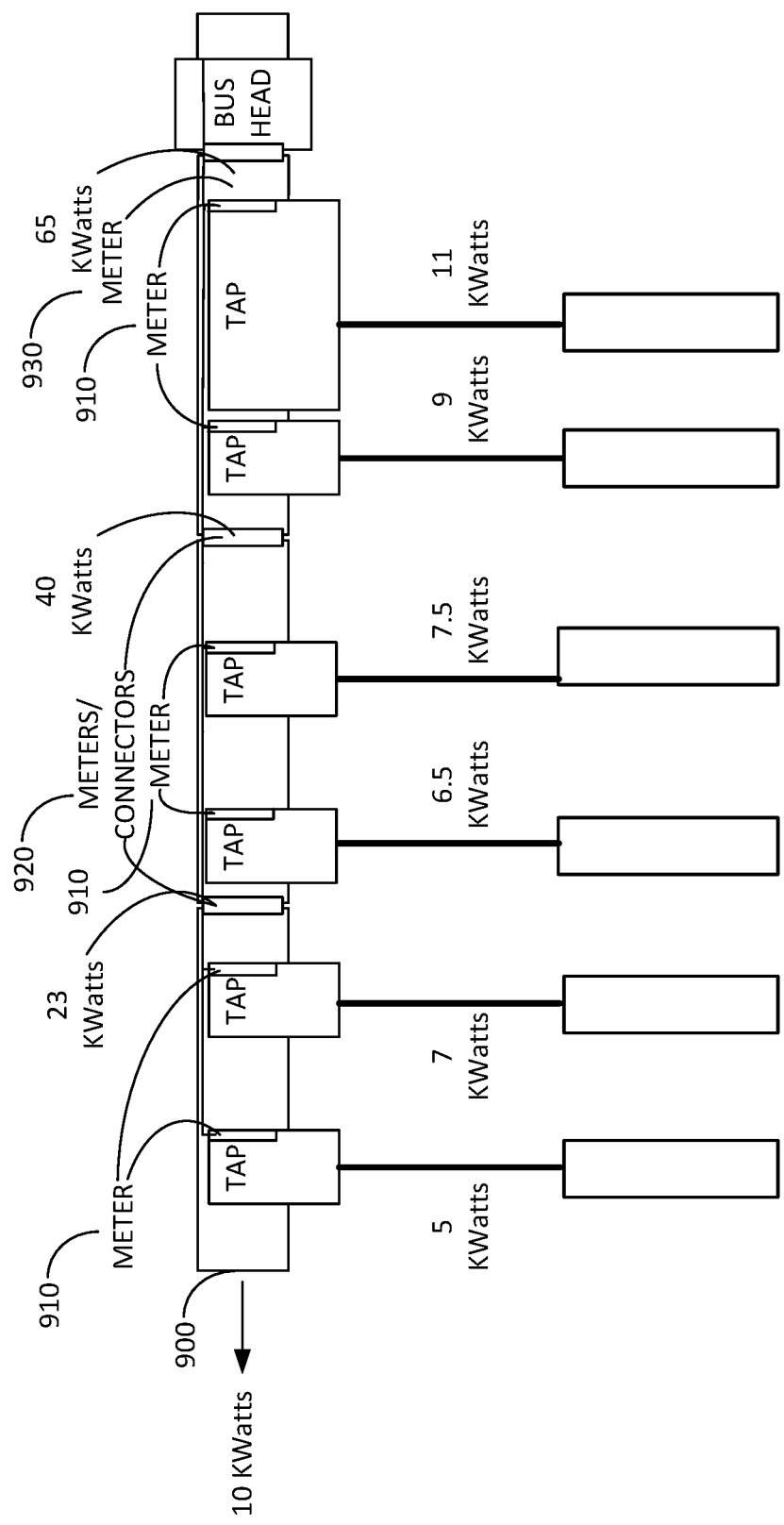
FIG. 12 illustrates a system for determining energy dissipation between busway segments.
Figure 14:
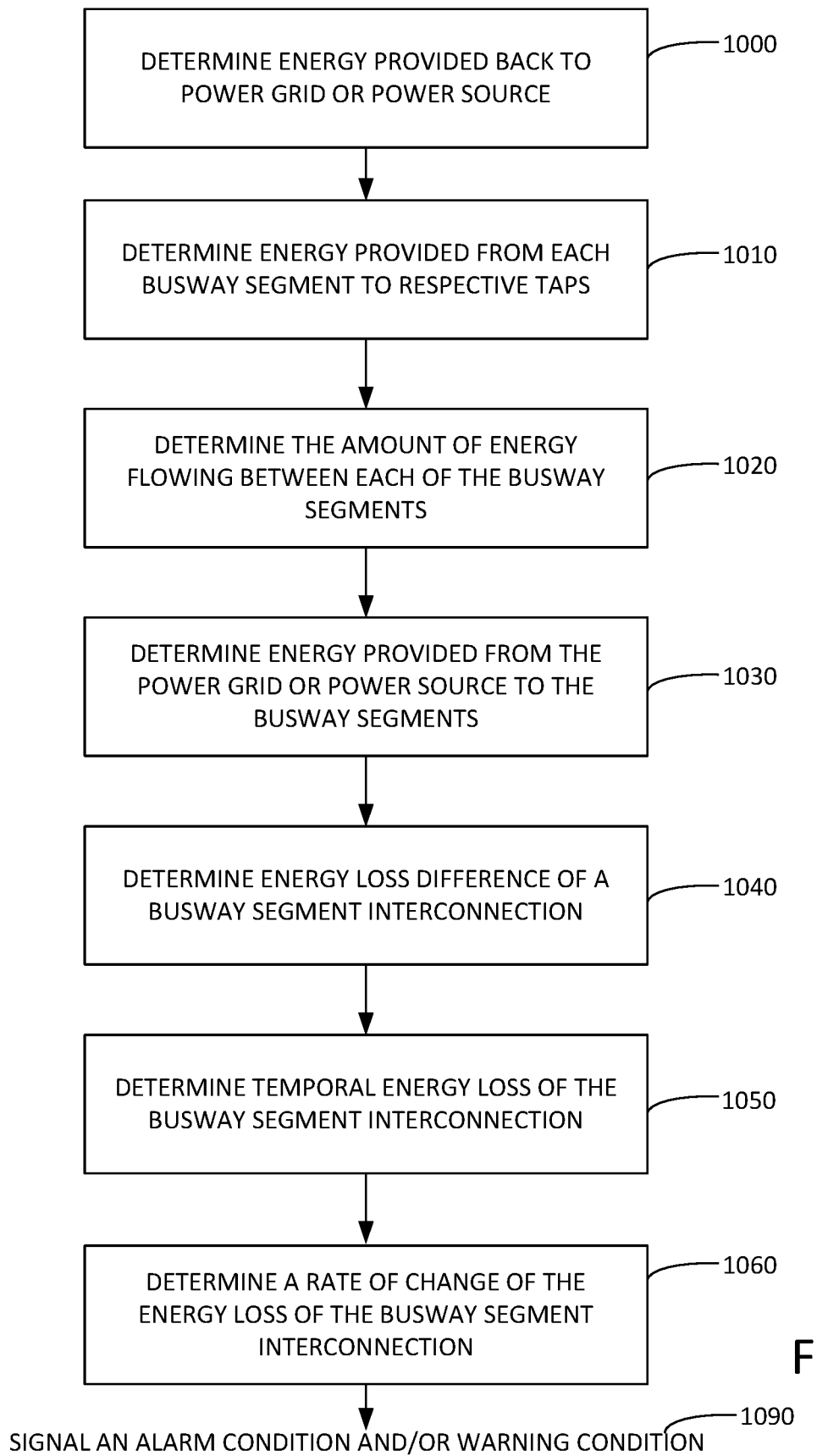
FIG. 14 illustrates an exemplary determination of busway energy dissipation.

Referring to FIG. 12 and to FIG. 14, in some instances, the physical/electrical interconnection between only one or more pairs of adjacent busways is poor, or otherwise builds up corrosion over an extended period of time. The poor physical/electrical interconnection may result in a failure of the interconnection between the adjacent busways, and in the extreme case result in an electrical fire. Further, a busway segment may develop faults at locations other than the busway segment to busway segment interconnection and/or the tap to busway segment interconnection. To determine whether the physical/electrical interconnection is poor, the electrical energy dissipated primarily by each physical/electrical interconnection between the busways may be determined. The energy that is provided back to the power grid or power source 1000 through the end of the busway segments, if any, may be measured 900. The energy provided from each of the busway segments to its respective taps may be measured 910, 1010. An energy meter may be included between each of the busway segments to determine the amount of energy flowing between each of the busway segments 920, 1020. The energy that is provided from the power grid or power source to the busway segments may be measured 930, 1030. The energy loss difference of a busway segment is determined 1040 as the energy provided to a busway segment minus the energy provided to the respective taps of the busway segment minus the energy provided to the next busway segment (or power grid or power source for the final busway segment) may be determined. If the power loss difference is sufficiently large between a pair of busway segments, indicative of a poor electrical interconnection, a warning or an alarm condition may be signaled 1090. Further, If the power loss difference is sufficiently large between a pair of busway segments based upon a temporal time period 1050, such as a day or a week, indicative of a poor electrical interconnection, a warning or an alarm condition may be signaled 1090. Moreover, determining a rate of change in the power loss difference over time 1060 may be used as a basis for predicting the failure of the interconnection between a pair of busway segments, and used as the basis of a warning or an alarm condition 1090. The power loss difference thereof may be adjusted based upon current levels and/or voltage levels and/or energy flowing. In the example shown in FIG. 12, the taps of the leftmost busway segment consumes 12 KWatts and 10 KWatts are provided to the next busway segment, power grid, or power source for a total of 22 KWatts. An energy meter between the leftmost busway segment and the middle busway segment senses 23 KWatts provided to the leftmost busway segment, which indicates that the leftmost busway segment consumes 1 KWatt. The taps of the middle busway segment consumes 14 KWatts. An energy meter between the middle busway segment and the rightmost busway segment senses 40 KWatts provided to the middle busway segment, which indicates the middle busway segment consumes 3 KWatts. An energy meter from the bus head senses 65 KWatts provided to the rightmost busway segment. The taps of the rightmost busway segment consumes 20 KWatts which also provides 40 KWatts to the middle busway segment, which indicates the rightmost busway segment consumes 5 KWatts. The energy consumed by one or more of the busway segments, the temporal changes of the energy consumed by one or more of the busway segments, and/or the rate of temporal changes of the energy consumed by one or more of the busway segments, may be used as the basis of a warning or an alarm condition.

In general, the voltage sensed from each busway segment should be lower than the previous busway segment from the head of the bus moving toward the end of the bus. In addition, the voltage sensed by each meter for a respective tap for each busway segment should sense a slightly decreasing voltage level as a result of the resistance of the respective busway segment. Accordingly, from the head of the bus moving toward the end of the bus the voltage sensed should be an ever decreasing voltage level or the same voltage level. If a voltage meter toward the end of the busway senses a voltage higher than a voltage meter toward the head of the busway senses, it is likely that a high resistance connection exists to the respective tap, and may be used as the basis of a warning or an alarm condition.

A similar process to the energy metering may be used for the voltages, to determine the difference in voltages between adjacent busway segments, which may be used as the basis of a warning or an alarm condition.

A similar process to the energy metering may be used for the voltages, to determine the difference in voltages, if any, between adjacent taps of the same busway segments, which may be used as the basis of a warning or an alarm condition.

A similar process to the energy metering may be used for the currents, to determine the difference in currents between adjacent busway segments, which may be used as the basis of a warning or an alarm condition.

A similar process to the energy metering may be used for the currents, to determine the difference in voltages, if any, between adjacent taps of the same busway segments, which may be used as the basis of a warning or an alarm condition.

It is noted that the apparent power being sensed, as a multiplication of the current and voltage, is typically substantially the same as the real power since the losses of a busway segment are typically substantially resistive in nature.

Figure 15:
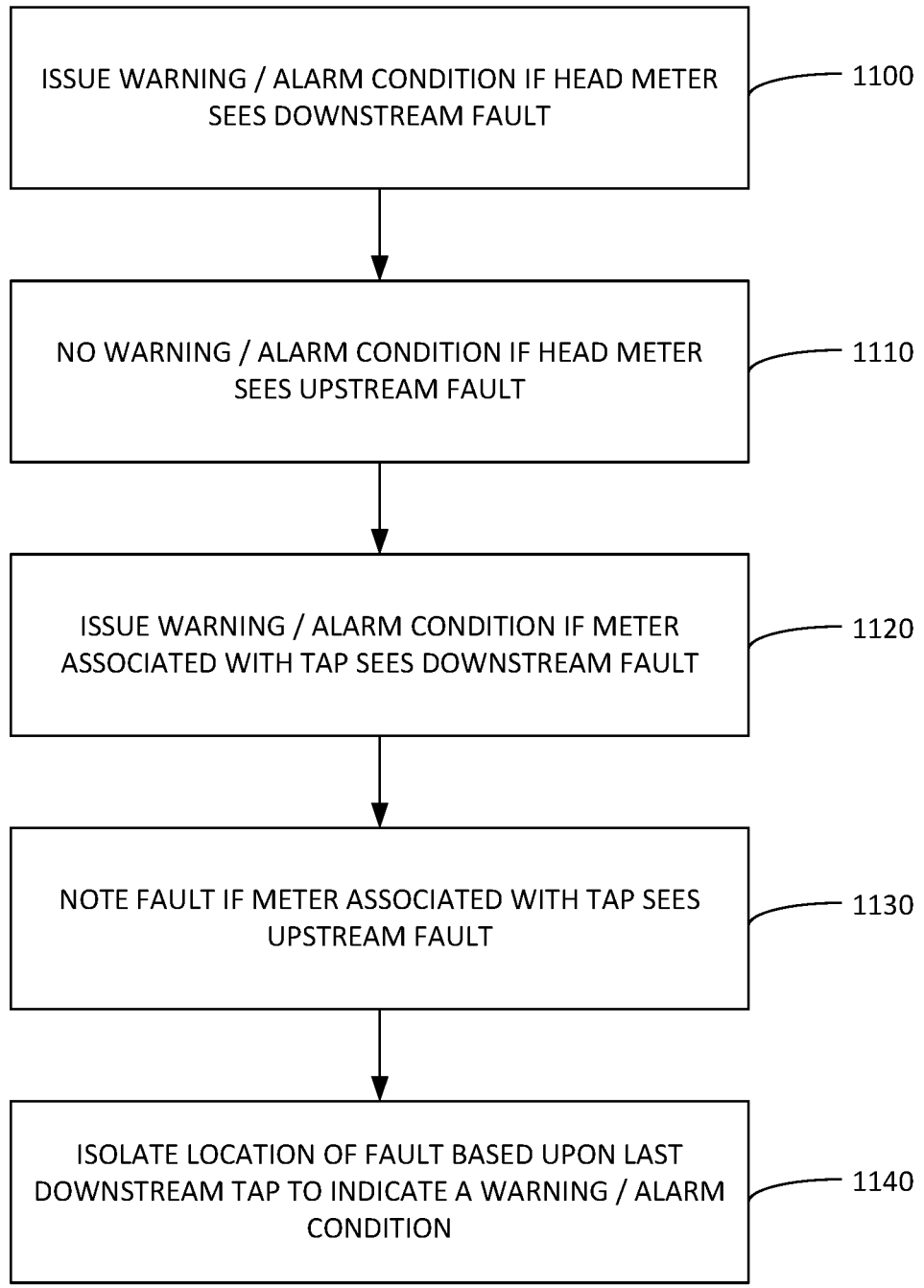
FIG. 15 illustrates an exemplary technique for fault location determination.

Referring to FIG. 15, the meters on the respective tap and/or the meter associated with the head may each include a disturbance detection technique to determine the direction from which a fault originated. One exemplary disturbance direction technique is described in U.S. Pat. No. 7,138,924, incorporated by reference herein in its entirety. If the meter associated with the head sees a fault downstream on its bus, it may indicate a warning and/or alarm condition 1100. If the meter associated with the head sees a fault upstream on its bus, it typically does not indicate a warning and/or alarm condition 1110 because there are likely other meters equipped with the disturbance detection technique that can further isolate the fault. If the meter associated with the tap sees a fault downstream on its bus, it may indicate a warning and/or alarm condition 1120. If the meter associated with the tap sees a fault upstream on its bus, it typically does not indicate a warning and/or alarm condition because there are likely other meters equipped with the disturbance detection technique that can further isolate the fault, but rather notes that a fault was detected 1130. Based upon the set of disturbances indicated as a warning and/or alarm and those noted, if desired, the system may isolate the location of the fault based upon the last downstream tap to indicate with a warning and/or alarm condition 1140, and further based upon those noted, if desired.

In a normal mode of operation, the different phases within the busway segments are balanced (e.g., the line-to-neural voltages and/or the line-to-line voltages are substantially equal). The energy meter of a respective tap may sense the respective voltage levels and determine whether the different phases within the respective busway segment are balanced. In the event that the different phases within the busway segment are not balanced, a warning and/or alarm condition may be indicated.

As previously described busway systems can develop faults. Such faults may be in the form of a high resistance in the bolted joints between each busway section, or in the busway segments themselves. The joints can develop high resistance due to not being properly bolted or corrosion over time. If not found, such bad joints can become extremely hot and fail with an arc flash explosion. Using the voltage and current measured by the head and tap meters, the power dissipated in each segment of the bus can be calculated. This may be performed by using the meter associated with the tap (and the meter associated with the head, if available), without necessarily adding metering within the busway itself. Working from the busway end toward the head, the currents measured at the taps may be added to determine the current in the bus between each tap. The voltage drop in the busway between each tap may be calculated by looking at the difference between that measured at each tap. Knowing the current in each portion of the busway, and the voltage drop, the system may calculate the power dissipated between each tap in the busway and provide an alarm condition if it is too high. Faults, such as shorts between the busway segments may be located using the technique described above, or comparing the current at the head to the total of the currents at the taps. Such current comparison should substantially be the same, and if not, current is being lost due to a fault, such as a short. A high power level would indicate a high resistance in the segment. If this power is over a numeric of percentage threshold, the segment is preferably provided a warning/alarm condition. Moreover, by using the distance between taps, the warning/alarm condition may be indicated in terms of watts dissipated per length at the calculated current.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A busway for power distribution to equipment positioned in information technology racks, the busway comprising:
    (a) a plurality of locations in said busway suitably being configured to receive a plurality of detachably engageable taps;
    (b) said busway including a plurality of segments, each of which are detachably engaged with one another, where each of said segments is detachably engaged in an end to end manner to form said busway that is arranged as a straight line, where a first one of said segments has a respective first end and a second end, where a second one of said segments has a respective first end and a second end, where a third one of said segments has a respective first end and a second end, where said second end of said first one of said segments is interconnected with said first end of said second one of said segments, where said second end of said second one of said segments is interconnected with said first end of said third one of said segments, where said first end of said first one of said segments and said second end of said third one of said segments are at opposing ends of the combination of said first segment, said second segment, and said third segment said detachably engaged in said end to end manner to form said busway arranged as said straight line;
    (c) each of said plurality of segments including at least one of said plurality of locations;
    (d) said busway is external to said information technology racks;
    (e) said busway providing power to said information technology racks by respective said taps;
    (f) each of said taps including therein a respective circuit breaker selectively electrically interconnecting a respective electrical interconnection between a respective segment of said busway of a respective one of said information technology racks so that power may be selectively provided from said respective segment to said respective one of said information technology racks based upon the state of said respective circuit breaker, wherein said state includes open and closed, each of said taps including therein a respective first electrical sensor that senses at least one of a voltage level and a current level within of a respective said tap at a first electrical location between said respective circuit breaker and said respective segment of said busway so that when said respective circuit breaker is changed from closed to opened said at least one of said voltage level would remain substantially unchanged while said current level would be substantially zero and so that when said respective circuit breaker is changed from opened to closed said at least one of said voltage level would remain substantially unchanged while said current level would not be substantially zero;

(g) each of said first electrical sensors providing a first output signal to a computing device;

(h) said busway including a plurality of second electrical sensors external to any of said taps each of which senses at least one of a voltage level and a current level of said respective segment of said busway at a second electrical location external to said tap, such that said first electrical location is not electrically isolated from said second electrical location by selectively disconnecting said respective circuit breaker;

(i) each of said second electrical sensors providing a second output signal to said computing device.

2. The busway for power distribution of claim 1 further comprising said plurality of information technology racks, each of which including said computing device therein.

3. The busway for power distribution of claim 2 further comprising said plurality of information technology racks, each of which including said computing device therein including a computer server.

4. The busway for power distribution of claim 1 wherein each of said plurality of segments are detachably engaged with one another with bolts.

5. The busway for power distribution of claim 1 wherein said second electrical sensor is a voltage sensor sensing said voltage level.

6. The busway for power distribution of claim 1 wherein said second electrical sensor is a current sensor sensing said current level.

7. The busway for power distribution of claim 1 wherein said second electrical sensor includes a current sensor sensing said current level and a voltage sensor sensing said voltage level.

8. The busway for power distribution of claim 7 further comprising determining a power level based upon said current level and said voltage level.

9. The busway for power distribution of claim 1 wherein each of said second electrical sensors is a supported by a respective one of said taps.

10. The busway for power distribution of claim 1 further comprising a processing module that receives said output signals and determines electrical characteristics of said plurality of segments of said busway.

11. The busway for power distribution of claim 1 further comprising each of said taps including a respective temperature sensor that senses a temperature level, and each of said temperature sensors providing a temperature signal to said computing device.

12. The busway for power distribution of claim 11 further comprising a processing module that receives said temperature signals and determines electrical characteristics of said plurality of segments of said busway.

13. The busway for power distribution of claim 1 further comprising each of said taps including a respective circuit breaker.

14. The busway for power distribution of claim 1 further comprising a processor determining energy dissipation between at least two of said segments.

15. The busway for power distribution of claim 1 further comprising a processor determining energy dissipation between at least two of said taps.

16. The busway for power distribution of claim 1 further comprising a processor determining a voltage increase of said busway between a first tap and a second tap, where said first tap if further electrically distant from a head end of said busway than said second tap, where current of said busway goes from said head end toward said second tap and goes from said second tap toward said first tap.

17. The busway for power distribution of claim 1 further comprising a processor determining energy dissipation of one of said segments.

18. The busway for power distribution of claim 1 further comprising determining a direction of a fault relative to a tap based upon detecting a disturbance by said second electrical sensor associated with said tap.

* * * * *